United States Patent

Oberstarr

[19]

[11] Patent Number: 5,975,920
[45] Date of Patent: *Nov. 2, 1999

[54] ELECTRONIC COMPONENT FOR SURFACE MOUNTING TECHNOLOGY

[75] Inventor: Reinhard Oberstarr, Polling, Germany

[73] Assignee: Otto Dunkel GmbH Fabrik fur Elektrotechnische Gerate, Muhldorf, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/648,667

[22] Filed: May 16, 1996

[30] Foreign Application Priority Data

May 16, 1995 [DE] Germany .......................... 195 17 977

[51] Int. Cl.⁶ ....................................................... H01R 9/09
[52] U.S. Cl. ............................................. 439/83; 439/910
[58] Field of Search ........................... 439/83, 910, 876; 228/180.21, 234.1, 254; 29/843, 842

[56] References Cited

U.S. PATENT DOCUMENTS

| | | | |
|---|---|---|---|
| 4,540,232 | 9/1985 | Zibung | 439/83 |
| 4,990,108 | 2/1991 | Sakaguchi | 439/910 |
| 5,096,440 | 3/1992 | Katsumata | 439/570 |
| 5,169,322 | 12/1992 | Frantz et al. | 439/83 |
| 5,203,710 | 4/1993 | Miyazawa | 439/71 |
| 5,226,825 | 7/1993 | Ricci, Jr. et al. | 439/876 |
| 5,281,152 | 1/1994 | Takahashi et al. | 439/83 |
| 5,342,220 | 8/1994 | Kodama | 439/607 |
| 5,547,384 | 8/1996 | Benjamin | 439/83 |
| 5,607,313 | 3/1997 | Nyman | 439/83 |

FOREIGN PATENT DOCUMENTS

| | | |
|---|---|---|
| 2343235 | 3/1975 | Germany . |
| 3803528 | 8/1988 | Germany . |
| 4203605 | 8/1992 | Germany . |
| 2256755 | 12/1992 | United Kingdom ..................... 439/83 |

*Primary Examiner*—Gary F. Paumen
*Attorney, Agent, or Firm*—Jacobson, Price, Holman & Stern, PLLC

[57] ABSTRACT

An electronic component for mounting on a PCB by a reflow soldering method has a conductor element mounted on an insulating component body, the conductor element having a contact region exposed on the exterior of the component body to connect the component to the PCB. In order to increase the numerical mounting density of such electronic components on the PCB a window is provided in the body of the component, which allows IR radiation to pass through the component body to the contact region of the conductor element.

18 Claims, 2 Drawing Sheets

ELECTRONIC COMPONENT FOR SURFACE MOUNTING TECHNOLOGY

BACKGROUND OF THE INVENTION

This invention relates to an electronic component for surface mount technology (SMT), having a component body comprised of an electrically insulating material, and at least one conductor element mounted on said body, which conductor element is comprised of electrically conducting material and has a contact region which is exposed to the exterior of the component body, which contact region serves to connect the component to a printed circuit board (PCB) or the like.

Customarily, an electronic component is connected to a PCB by inserting the conductor elements of said component into bores provided in the PCB, and then soldering the conductor elements in said bores.

To simplify the automated mounting of electronic components onto PCBS, in recent years a soldering technology has been developed which is known as SMT (surface mount technology), as a replacement for the traditional bore soldering technology. With SMT, the contact regions of the conductor elements are placed against a surface region of the PCB which region is typically coated with a soldering paste comprising materials which can be caused to produce a soldered joint. The soldering paste is then heated by IR radiation, to produce a connection between the electronic component and the PCB. This technique is known as the "reflow method". Alternatively, a vapor phase soldering process may be used, wherein the entire electronic component is enclosed in a space filled with a solvent and steam; the heat of condensation of the steam on the cold electronic component brings about the solder joint. However, this technique is objectionable because it poses environmental problems. The reflow method will now be described, with reference to FIGS. 3a and 3b of the accompanying drawings.

The fixing of an electronic component in the form of a plug connector, to a PCB (230, in FIG. 3a) will be described, with reference to FIG. 3a of the drawings: The plug connector is comprised of a body 210 of insulating material having a plate-shaped bottom member 212 and a wall 214 extending perpendicular thereto. Two conductor elements 220 pass through the bottom member 212. Outside of the body 210 the conductor elements have exposed contact regions 222, and inside of body 210 the conductor elements have plug-like regions 224 which can be inserted in a contact socket.

To fix the plug connector to the PCB according to the known "reflow method", the contact regions 222 are applied to a region of the PCB bearing a soldering paste, and then said paste is melted by means of infrared (IR) radiation applied to the contact region in the directions indicated by arrows 226, and the melted solder is allowed to solidify. The result is a strong and durable connection between the PCB and the plug connector.

To avoid shadow formation, caused by neighboring components, and which interferes with the action of the IR irradiation on the contact region, it has been proposed to chamfer the body 210 at the transition between the plate-shaped bottom member 212 and the wall 214 extending perpendicularly thereto (see inclined surfaces 218 FIG. 3b). This state of the art is disclosed, for example, in German OS 42 03 605 A1. If the other geometric parameters are left unchanged, the introduction of the chamfer increases the maximum angle of incidence, α, with respect to the PCB (230), of the IR radiation incident on the contact region 222 without shadow formation. The chamfer feature enables a higher density of electronic components to be mounted on the area of the PCB using the surface soldering technique, due to the fact that the maximum angle of incidence of irradiation is increased by the chamfers 218, which in turn reduces the minimum separation between components which is required to avoid formation of shadows by neighboring components.

Although the mounting density of components on a PCB can be greatly increased by the feature, the maximum achievable angle of incidence α is still limited, and thus the maximum achievable mounting density is limited, e.g. by the constraints imposed generally by the geometry of the component, namely the extent of the wall 214. Further, a problem is presented with the customary arrangement of electronic components fixed to a PCB by means of surface soldering techniques, namely that the range of angles at which the IR radiation may be supplied to the contact region is small, and the greater the mounting density the smaller becomes said range of angles. For a given IR source, this reduces the IR power available for melting, and thereby increases the time required to achieve melting.

SUMMARY OF THE INVENTION

In view of the above-described drawbacks of the state of the art, an object of the present invention is to provide an electronic component having a configuration such that it can be fixed rapidly to a PCB by means of surface soldering techniques, even under conditions of high numerical mounting density of components.

The inventive electronic component is distinguished essentially in that a window is provided in the body of the component, which allows the IR radiation to pass through it to the contact region.

The window allows the IR radiation in the reflow method to be directed through the body and onto the contact region, without shadow formation. For example, IR light may be directed perpendicularly to the PCB and onto the contact region, without shadow formation. Under these conditions the solder paste can be melted to produce the connection between the electronic component and the PCB, uninfluenced by shadow formation from neighboring electronic components and by the reduction of the IR power available for melting which reduction results from such shadow formation. Thus, when electronic components according to the invention are employed, the only limitation on the density of mounting of components on a PCB is that posed by the dimensions and shape of the components themselves. Moreover, increased density does not come at a cost in terms of increased manufacturing time needed to produce the connection between the electronic components and the PCB. Further, the inventive component allows use of the reflow method to produce a connection to the PCB even if the connection is to be made with printed conductors disposed under the component and inside the outer boundary of the component. Such circumstances may well be presented in the case of a component in the form of a plug connector.

The window may be provided in simple fashion in the form of an opening extending through the body of the component. However, an IR-transparent solid material may be used for the window and this will protect the contact region.

In an electronic component in the form of a plug connector according to the invention the conductor element may extend completely through the component body, having a contact region on one side of said body, and an exposed contact part on the opposite side of said body. The contact part may be in the form of a pin or plug to be engaged in a contact socket. Alternatively, the contact part may comprise a socket configuration for accommodating a pin or plug. The contact part may also comprise a spring-loaded structure for pressing against a second PCB.

The window may have a structure such that the cross section of the window narrows progressively towards the contact region, so as to avoid passing IR radiation to a region of the PCB which is not sought to be heated.

A particularly reliable connection between the electronic component and the PCB can be achieved if the component body is essentially planar (plate-shaped) in the region of the window, and the contact region extends parallel to the plate-shaped region of the component body.

If the contact region is suitably disposed with respect to the window, IR radiation incident perpendicularly upon the plate-shaped region of the component body will tend to irradiate the contact region.

According to a particularly advantageous refinement of the invention, a plurality of conductor elements are fixed to the component body, which conductor elements are disposed in a linear array or in an array comprising a series of generally parallel lines, with each conductor element having a contact region which is uncovered with respect to the exterior of the component body. Windows provided in the component body admit IR radiation to act on each of said contact regions.

With each contact region having a window, particularly reliable connecting of the electronic component to the PCB can be achieved.

Preferably, a guide element is provided on the face of the component body which is directed toward the contact region, for positioning the component with respect to the PCB, and for absorbing transverse forces which act on the contact regions. The guide element may be a recess for accommodating a guide nub fixed to the PCB, or may be a guide nub fixed to the component body, which engages a recess in the PCB.

BRIEF DESCRIPTION OF THE DRAWINGS

The invention will be described further, with reference to the accompanying drawings. Any features disclosed in the drawings and not further elucidated in the Specification, is herewith incorporated in the Specification by reference.

FIG. 2b is a cross sectional view of the electronic component according to FIG. 2a.

DETAILED DESCRIPTION OF THE PREFERRED EMBODIMENTS

Figure 1:
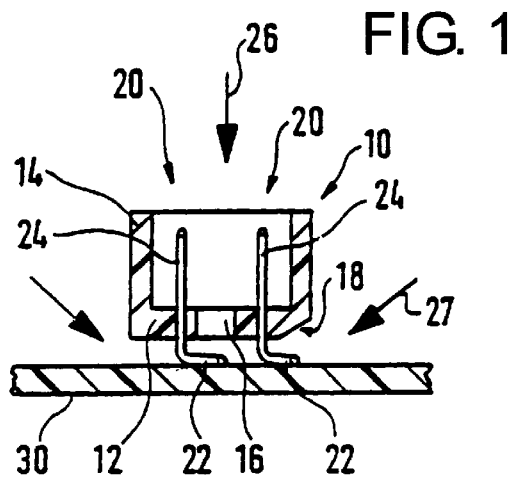
FIG. 1 is a vertical cross-sectional view of an electronic component in the form of a plug connector according to a first embodiment of the invention.

The plug connector illustrated in FIG. 1 has a body 10 with a plate-shaped bottom member 12 and a wall 14 which extends perpendicularly to the bottom member. Two conductor elements 20 extend through the bottom member. On the outside of body 10, facing a PCB 30, each conductor element 20 has a contact region 22; and on the inside of body 10 facing away from the contact region 22 each conductor element 20 has a pin-shaped plug region 24.

A window in the form of an opening 16 passing through the bottom member 12 of the body 10 is provided, in order to admit IR radiation to the contact region 22 of one of the conductor elements 20, the left element in FIG. 1. The contact region 22 of the left conductor element 20 can thereby be irradiated by IR radiation incident in a direction perpendicular to the PCB 30, as illustrated by arrow 26. A chamfer 18 is provided in body 10 at the transition between the bottom member 12 and the wall 14, to enable shadow-free IR-irradiation of the other conductor element 20, the right element in FIG. 1. The arrow 27 indicates the direction of incidence of IR radiation which can be directed at the contact region 22 of the right conductor element 20.

Figure 2B:
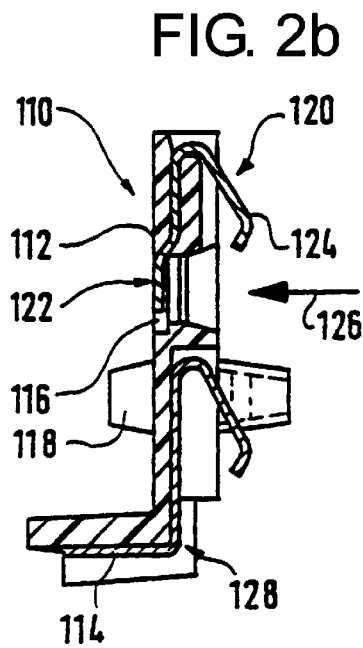
Figure 3A:
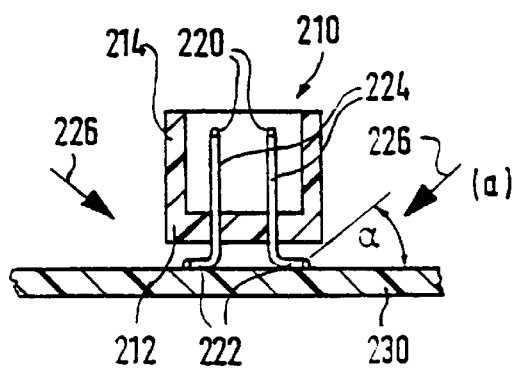
FIGS. 3a and 3b are views a view similar to FIG. 1 of known electronic components.
Figure 3B:
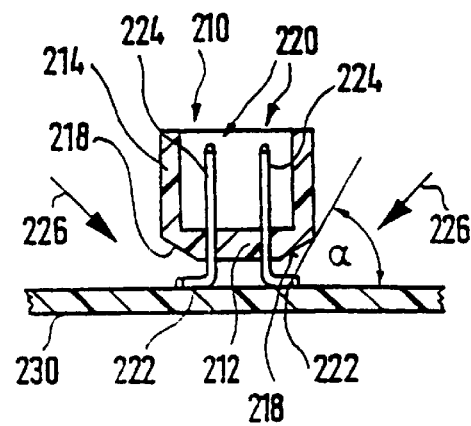
Figure 2A:
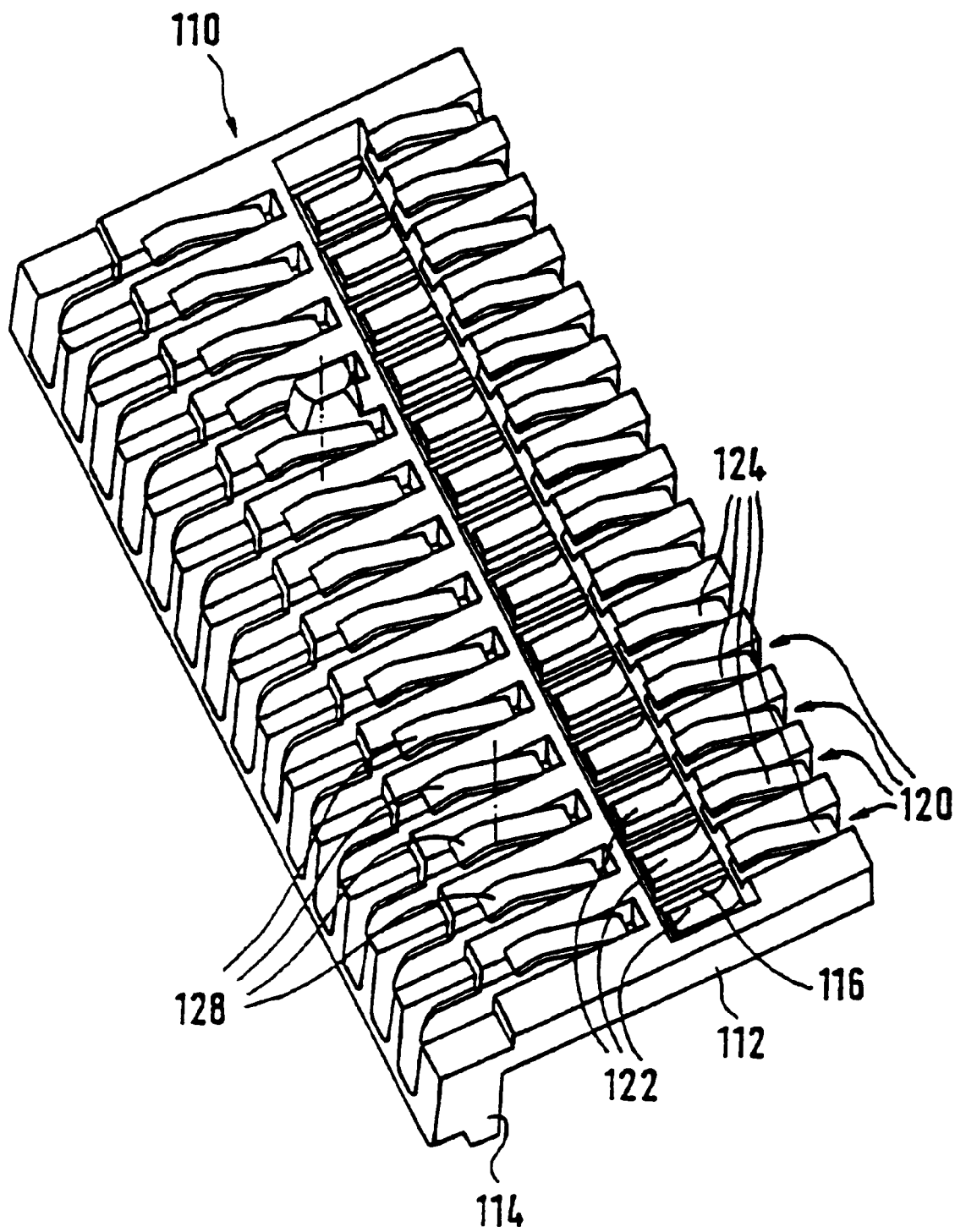
FIG. 2a is a perspective view of an electronic component according to a second embodiment of the invention.

The electronic component illustrated in FIGS. 2a and 2b has a body 110 and fourteen contact elements affixed to a plate-like region 112 of the body 110, which contact elements are arrayed along a line and are each in the form of a spring contact device 120 which is bent over itself. Each spring contact device 120 has a contact region 122 which is uncovered with respect to the exterior of the body 110. The region 122 will serve to fix the spring contact device 120 to a PCB (not shown) by the reflow method. The spring contact device 120 also has a spring-like contact member 124 which can be introduced into a contact socket, jack or the like, or which can be pressed against a second PCB. The plate-like region 112 of the body 110 has a throughgoing opening 116 in the region of each of the contact regions 122. The cross section of opening 116 decreases progressively towards the contact regions, as seen in FIG. 2b. IR radiation, indicated by arrow 126, is directed through the opening 116 and onto the contact regions 122 of the conducting contact elements 120, to attach the electronic component to a PCB not shown. Two guide elements or guide nubs 118 are provided on the face of the body 110 which is directed toward the contact region 122, to provide exact positioning of the component on the PCB and to secure the component against lateral forces acting parallel to the PCB. The nubs 118, one of which is illustrated in FIG. 2b, engage corresponding recesses in the PCB. As seen in FIG. 2a, a second row of mutually parallel disposed conductor elements 128 is mounted on the body 110, next to the row of conductor elements 120. The conductor elements 128 extend over a part of a generally L-shaped region of said body 110 comprising a projecting wall 114 (see FIG. 2b).

The invention is not limited to the exemplary embodiments illustrated in the drawings. For example, the conductor elements may have contact sockets, jacks, or the like, on the side of the body directed away from the contact regions. As another example, the thoroughgoing openings in the body which serve to admit IR radiation to the contact regions may be covered by a transparent solid window material which is transparent to IR radiation.

I claim:

1. An electronic component for surface mounting on a PCB by a reflow soldering method, the component comprising a component body of an electrically insulating material and having a base substantially parallel to a surface of the PCB, and at least one conductor element mounted upright within a through-hole on said body substantially normal to the base and having a contact region exposed on an exterior surface of the component body for connecting the component to the PCB and a window spaced from said through-hole and provided in said component body, located for allowing IR radiation to pass through said window to the contact region.

2. An electronic component according to claim 1; wherein the window is in the form of an opening in the component body.

3. An electronic component according to claim 1; wherein the conductor element extends through the component body, having the contact region on one side of said body, and a free contact part on an opposite side of said body.

4. An electronic component according to claim 3; wherein said contact part is one of a member to be engaged in a contact socket, and a spring-loaded structure for pressing against a second PCB.

5. An electronic component according to claim 4; wherein the contact part is in the form of a pin, or a plug.

6. An electronic component according to claim 3; wherein the contact part is in the form of a socket.

7. An electronic component according to claim 1 wherein the window has a cross-section which narrows progressively towards the contact region.

8. An electronic component according to claim 1 wherein the component body is essentially plate-shaped in a region containing the window, and the contact region of the conductor element extends parallel to said region of the component body.

9. An electronic component according to claim 8 wherein said window is disposed to direct IR radiation incident perpendicularly upon the plate-shaped region of the component body to irradiate the contact region of the conductor element.

10. An electronic component according to claim 1 wherein the conductor element is replicated in a linear array on the component body, each conductor element having a contact region which is exposed with respect to the component body, and windows provided in the component body to admit IR radiation to each of said contact regions.

11. An electronic component according to claim 10; wherein each contact region has a window, in the component body.

12. An electronic component according to claim 1 which includes a guide element on a face of the component body directed toward the contact region.

13. An electronic component according to claim 12; wherein the guide element comprises a guide nub on the component body to engage a recess in the PCB.

14. An electric component according to claim 1, wherein the component body has a bottom portion and the window is provided in the bottom portion of said component body.

15. An electronic component for surface mounting on a PCB by a reflow soldering method, the component comprising a component body of an electrically insulating material having a base substantially parallel to a surface of the PCB and at least one opening in the base, and at least one conductor element mounted upright on said body within said at least one opening and substantially normal to the base, the conductor element having a contact region exposed on an exterior surface of the component body for connecting the component to the PCB and a window spaced from said opening and provided in said component body, said window located for allowing IR radiation to pass through said window to the contact region.

16. The electronic component of claim 15, wherein one conductor is mounted in each at least one opening.

17. The electronic component according to claim 15, wherein the conductor element extends through the component body, having the contact region on one side of said body, and a free contact part on an opposite side of said body.

18. An electronic component for surface mounting on a PCB by a reflow soldering method, the component comprising a component body of an electrically insulating material and having a base substantially parallel to a surface of the PCB, and at least one conductor element mounted upright at a first location on said component body substantially normal to the base and having a contact region exposed on an exterior surface of the component body for connecting the component to the PCB and a window provided at a second location on said component body separate from the first location, the second location allowing IR radiation to pass through said window to the contact region.

* * * * *